United States Patent
Buchold et al.

(10) Patent No.: US 7,158,552 B2
(45) Date of Patent: Jan. 2, 2007

(54) LOW RELATIVE INTENSITY NOISE FIBER GRATING TYPE LASER DIODE

(75) Inventors: Bianca Buchold, Nuremberg (DE); Konrad Czotscher, Nuremberg (DE); Dieter Werner, Neunkirchen am Brand (DE)

(73) Assignee: Lucent Technologies Inc., Murray Hill, NJ (US)

( * ) Notice: Subject to any disclaimer, the term of this patent is extended or adjusted under 35 U.S.C. 154(b) by 272 days.

(21) Appl. No.: 10/779,469

(22) Filed: Feb. 13, 2004

(65) Prior Publication Data

US 2005/0180474 A1    Aug. 18, 2005

(51) Int. Cl.
H01S 3/30    (2006.01)
H01S 3/13    (2006.01)
H01S 3/00    (2006.01)

(52) U.S. Cl. .................... 372/38.08; 372/6; 372/29.02; 372/29.011

(58) Field of Classification Search ............. 372/38.08, 372/6, 29.02, 29.011
See application file for complete search history.

(56) References Cited

U.S. PATENT DOCUMENTS

| | | | |
|---|---|---|---|
| 5,042,897 A | * | 8/1991 | Meltz et al. .................. 385/37 |
| 5,659,414 A | * | 8/1997 | Appel et al. ................. 359/196 |
| 6,661,819 B1 | | 12/2003 | Ventrudo et al. |
| 2003/0067952 A1 | | 4/2003 | Naoki et al. |
| 2004/0076208 A1 | * | 4/2004 | Kazarinov et al. ............ 372/45 |
| 2004/0136053 A1 | * | 7/2004 | Sugiya .................... 359/337.1 |

FOREIGN PATENT DOCUMENTS

EP    05250508    6/2005

OTHER PUBLICATIONS

Dogru N et al: "Effect of intensity noise on mode-locked hybrid soliton pulse source" Optics Communications, North-Holland Publishing Co. Amsterdam, NL, vol. 220, No. 1-3 May 1, 2003, pp. 97-104, XP004422620 ISSN: 0030-4018.

* cited by examiner

Primary Examiner—Minsun Harvey
Assistant Examiner—Marcia A. Golub

(57) ABSTRACT

The dependency of intensity noise is used to determine the wavelength difference between a laser diode gain peak and a reflection peak of a fiber grating in a fiber grating type laser diode. Monitoring and determining the relative noise intensity of such a laser enables the control of the laser diode or the fiber grating such that the intensity noise is as low as possible. Such an approach enables the use of a fiber grating type laser diode as Raman pumps in high-speed transmission systems where low intensity noise is a requirement, especially when the Raman pump power propagates in the same direction as the transmission signals (known as Raman co-pumps).

27 Claims, 3 Drawing Sheets

LOW RELATIVE INTENSITY NOISE FIBER GRATING TYPE LASER DIODE

FIELD OF THE INVENTION

This invention relates to the field of laser sources and, more specifically, to low relative intensity noise fiber grating type laser diodes.

BACKGROUND OF THE INVENTION

The growth in telecommunication traffic is driving the development of technology to ever expand the available bandwidth of network communication. In particular, there is a great impetus towards increasing the capacity of optical communication links and reducing the costs of implementing capacity-increasing technologies. One method for increasing the capacity of optical communication links has been to combine optical signals with multiple wavelengths onto the same fiber, commonly referred to as wavelength division multiplexing (WDM). Essential to the development of WDM systems is the development of optical amplifier technology capable of boosting optical signals in a way that is transparent to data rate and format and that can provide effective amplification across a very large bandwidth.

Continuing development of WDM systems including DWDM (dense WDM) systems is increasing the challenges inherent in optical amplifier design. DWDM systems, for example, are capable of carrying hundreds of very closely spaced optical signals (i.e., spacing of less than 25 GHz). Amplifying such DWDM signals is problematic for a number of reasons. For example, if an unstabilized pump laser is used for pumping a Raman optical amplifier used for amplifying DWDM signals, the amplification range of the Raman optical amplifier will be limited by the limited dynamic range of the output power of the unstabilized pump laser. More specifically, if the output power of the unstabilized pump laser is altered by changing the injection current in an attempt to produce a more uniform gain across a given bandwidth, the average temperature of the laser chip is also altered. The change in the average temperature of the laser chip results in a change in the center emission wavelength of the laser and in turn changes the Raman gain of the Raman optical amplifier. As such, the power of an unstabilized pump laser must remain substantially constant, which results in a limited dynamic range.

To avoid the problems associated with using unstabilized pump lasers as optical pumps for Raman optical amplifiers, Fabry Perot (FP) type laser diodes with Fiber Bragg Grating (FBG) wavelength stabilization are typically used as pump sources for Raman amplifiers in high density and high speed optical transmission systems. Such laser diodes provide excellent wavelength stabilization and fixed output wavelengths. The relative intensity noise (RIN) of such stabilized lasers, however, is often insufficient for the stringent requirements of high speed and high density optical systems and applications.

SUMMARY OF THE INVENTION

The present invention overcomes the deficiencies in the prior art by, in several embodiments, providing wavelength stabilized and unstabilized fiber grating type laser diodes having low relative intensity noise.

In one embodiment of the present invention, a method for reducing the relative intensity noise of a fiber grating type laser diode having a fiber grating and a laser diode includes detecting a reflected portion of an optical signal of the laser diode, the reflected portion of the optical signal being reflected by the fiber grating, determining, from the detected optical signal, the relative intensity noise of the laser diode and reducing a difference between a maximum gain wavelength of the laser diode and a maximum reflection wavelength of a fiber grating of the fiber grating type laser diode in a manner tending to reduce the relative intensity noise of the fiber grating type laser diode.

In an alternate embodiment of the present invention, a relative intensity noise (RIN) control device for controlling the RIN of a fiber grating type laser diode having a fiber grating and a laser diode includes an optical detector for detecting a reflected portion of an optical signal of the laser diode, the reflected portion of the optical signal being reflected by the fiber grating, and a control unit having a memory for storing information and program instructions and a processor for executing the instructions, the control unit adapted to perform the steps of determining, from the detected optical signal, the relative intensity noise of the laser diode, and reducing a difference between a maximum gain wavelength of the laser diode and a maximum reflection wavelength of the fiber grating in a manner tending to reduce the relative intensity noise of said laser diode.

In yet an alternate embodiment of the present invention, a relative intensity noise (RIN) controlled fiber grating type laser diode includes a laser diode for providing an optical signal, a fiber grating for reflecting at least a portion of the optical signal back toward the laser diode, an optical detector for detecting the reflected portion of the optical signal of the laser diode, and a control unit having a memory for storing information and program instructions and a processor for executing the instructions. The control unit is adapted to perform the steps of determining, from the detected optical signal, the relative intensity noise of the laser diode, and reducing the difference between the maximum gain wavelength of the laser diode and the maximum reflection wavelength of the fiber grating in a manner tending to reduce the relative intensity noise of the laser diode.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Figure 1:
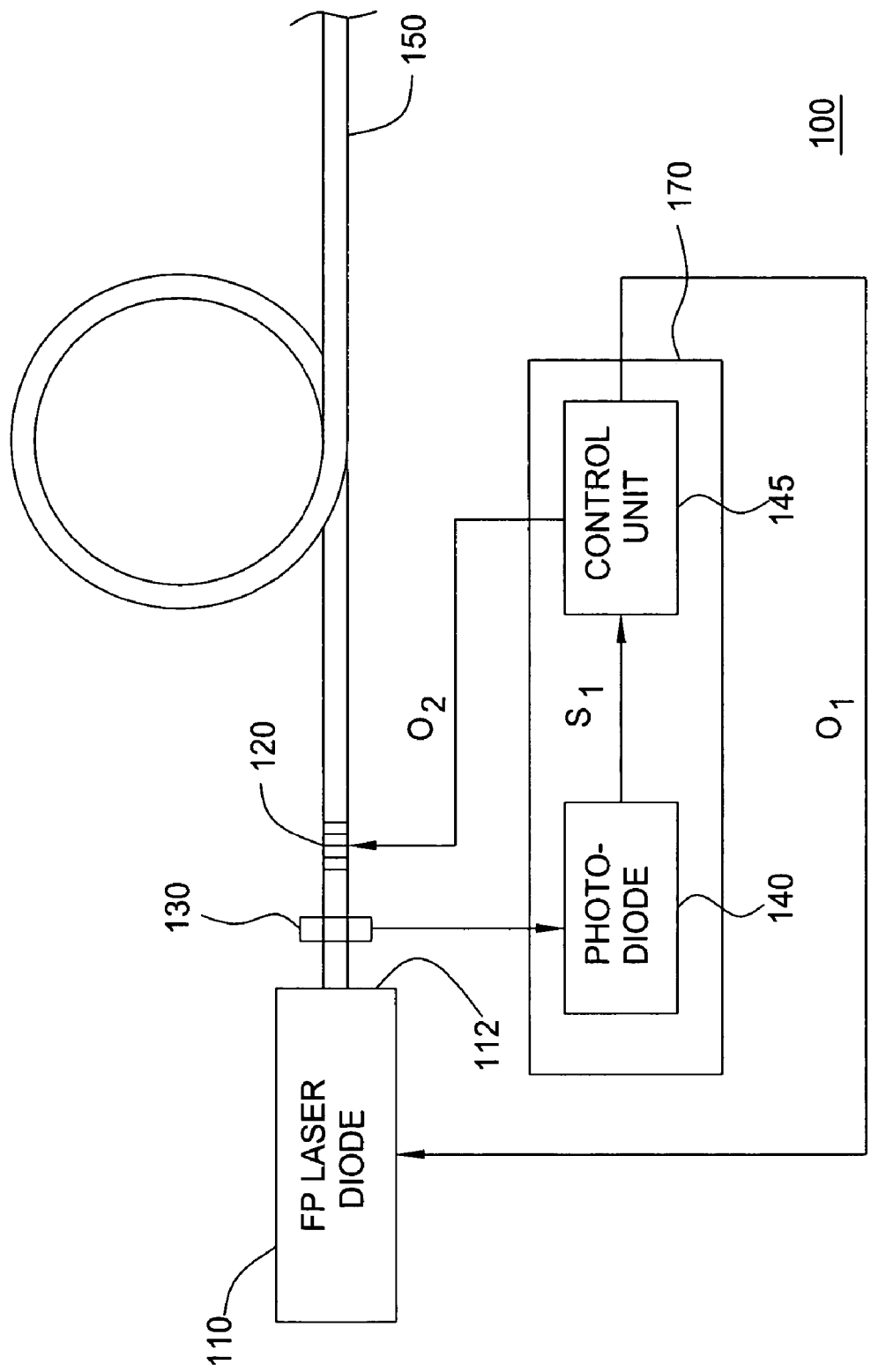
FIG. 1 depicts a high level block diagram of an embodiment of a low relative intensity noise (RIN) wavelength stabilized laser of the present invention.

Although various embodiments of the present invention are being described herein with respect to fiber grating stabilized laser diodes, the specific embodiments of the present invention described herein should not be treated as limiting the scope of the invention. It will be appreciated by those skilled in the art informed by the teachings of the present invention, that the concepts of the present invention may be applied in substantially any laser system having a fiber grating and for substantially any application wherein a laser having low relative intensity noise is desirable.

Fiber grating wavelength stabilized lasers typically comprise a laser diode, a focusing system, a fiber grating (typically a Fiber Bragg Grating) and a transmission fiber. The laser diode is pumped by current injection and is configured to emit radiation primarily from a front facet. In such fiber grating wavelength stabilized lasers, the optical signal of the laser diode is focused and coupled to the transmission fiber by the focusing system. The focused optical signal propagates along the transmission fiber to the intra-core fiber grating. The fiber grating is etched near the guided-mode portion of the transmission fiber. The fiber grating of such fiber grating wavelength stabilized lasers is fabricated such that the wavelength of its maximum reflection is within the gain bandwidth of the laser diode. The intra-core fiber grating reflects a fraction of the signal emission of the laser diode back through the transmission fiber into the laser diode. The remainder of the light passes through the fiber grating and propagates along the remaining length of transmission fiber. The effect of the fiber grating on the characteristics of the laser diode optical output is explained by considering the wavelength-dependent gain in the coupled cavity formed by the fiber grating. The optical feedback from the fiber grating effectively increases the gain from the laser cavity of light within the bandwidth of the fiber grating. It is well known that the laser can operate preferentially near the wavelength of highest gain, hence the wavelength of the laser diode is shifted from its free running value to the wavelength of the fiber grating. This occurs if the wavelength of the fiber grating is within the gain bandwidth of the laser diode, provided the magnitude of reflectivity from the fiber grating is sufficient.

The behavior of the laser diode under conditions of optical feedback is complicated by the effect of the laser diode cavity itself, which is formed by the end facets of the semiconductor chip. The reflectivity of the fiber grating as well as its wavelength, are selected such that the broadband feedback from the laser diode cavity is greater than the feedback from the fiber grating. In this circumstance, the feedback from the fiber grating acts as perturbation of the coherent electric field formed in the laser diode cavity. This perturbation acts to break the coherence of the emission of the laser diode, thus broadening the bandwidth of the emission by several orders of magnitude. The fiber grating effectively locks the cavity output of the laser diode to the fixed wavelength of the fiber grating and centers the external cavity multi-longitudinal modes around that wavelength. In addition, the center wavelength of emission from the laser diode remains near the wavelength of maximum reflection of the fiber grating. The laser diode is thus constrained to operate within the bandwidth of the fiber grating, such that large fluctuations in wavelength of the laser diode caused by changes in temperature or current are eliminated. That is, the laser diode of the fiber grating wavelength stabilized laser does not undergo transitions of longitudinal laser cavity modes as are observed in free-running laser diodes. Such transitions cause large intensity fluctuations in the laser diode output caused by competition between two modes during the transition. These mode transitions are caused by changes in laser injection current or temperature, for example, and are detrimental to the operation of an optical amplifier or laser.

The inventors noted that in such fiber grating wavelength stabilized lasers, the higher the separation between the gain peak of a laser diode and the reflection peak of a fiber grating, the higher the relative intensity noise. As such, the inventors propose herein a novel method and apparatus for the control of fiber grating-type stabilized and unstabilized lasers using intensity noise detection.

FIG. 1 depicts a high level block diagram of an embodiment of a relative intensity noise (RIN) controlled wavelength stabilized laser of the present invention. The RIN controlled wavelength stabilized laser 100 of FIG. 1 comprises a laser diode (illustratively a Fabry-Perot (FP) laser diode) 110, a fiber grating (illustratively a Fiber Bragg Grating) 120, an optical tap 130, an optical detector (illustratively a photodiode) 140, a control unit 145 and a transmission fiber 150. Optionally, the RIN controlled wavelength stabilized laser 100 of FIG. 1 may further comprise an optical isolator (not shown) located downstream from the fiber grating 120 to prevent optical power from the transmission line (e.g. from backward Raman pumps or ASE noise from an EDFA) from reaching the laser diode 110 and cause RIN degradation. In the RIN controlled wavelength stabilized laser 100 of FIG. 1, the optical detector 140 and the control unit 145 together comprise an RIN control device 170. The utility of the RIN control device 170 will be described with respect to an alternate embodiment of the present invention described below.

Although various components of the RIN controlled wavelength stabilized laser 100 of FIG. 1 are depicted as specific devices, other such devices that perform substantially similar functions as the depicted elements may be substituted for the illustrated components of FIG. 1. For example, the optical detector 140 of the RIN controlled wavelength stabilized laser 100 of FIG. 1 may be an optical spectrum analyzer (OSA) or an optical channel monitor (OMON). In such embodiments of the present invention, the OSA or OMON may determine a wavelength difference between a laser diode gain peak and a reflection peak of a fiber grating by determining an optical spectrum of an optical feedback signal, described in greater detail below. In addition, although the control unit 145 of the RIN controlled wavelength stabilized laser 100 of FIG. 1 is depicted as a separate unit, the control unit 145 may be advantageously configured in various other formats. For example, the control unit of the present invention may be incorporated into a single unit including the optical detector of the present invention.

Figure 2:
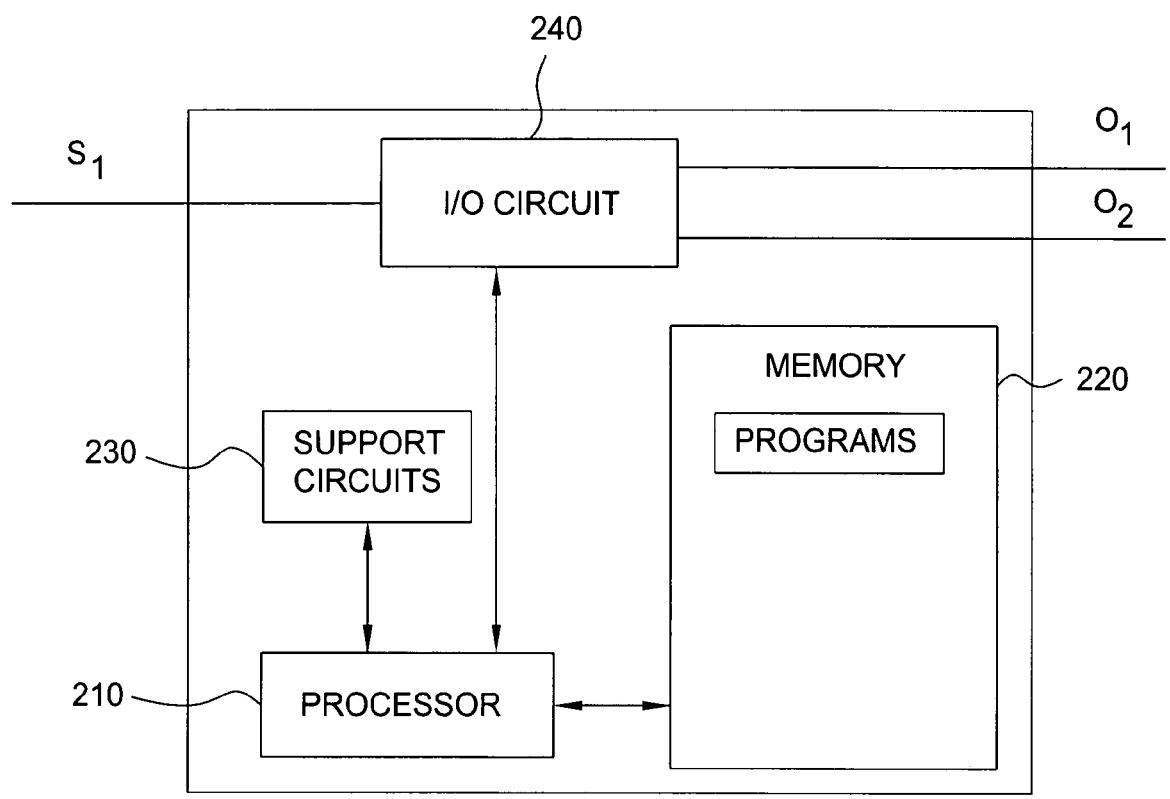
FIG. 2 depicts a high level block diagram of an embodiment of a control unit suitable for use in the low RIN wavelength stabilized laser of FIG. 2.

FIG. 2 depicts a high level block diagram of an embodiment of a control unit suitable for use in the RIN controlled wavelength stabilized laser 100 of FIG. 1. The control unit 145 of FIG. 2 comprises a processor 210 as well as a memory 220 for storing information and control programs. The processor 210 cooperates with conventional support circuitry 230 such as power supplies, clock circuits, cache memory and the like as well as circuits that assist in executing the software routines stored in the memory 220. As such, it is contemplated that some of the process steps discussed herein as software processes may be implemented within hardware, for example, as circuitry that cooperates with the processor 210 to perform various steps. The control unit 145 also contains input-output circuitry 240 that forms an interface between the various functional elements communicating with the control unit 145. For example, in the embodiment of FIG. 1, the control unit 145 communicates with the optical detector 140 via a signal path S1 and to the laser diode 110 and the fiber grating 120 via signal paths $O_1$ and $O_2$, repsectively.

Although the control unit 145 of FIG. 2 is depicted as a general purpose computer that is programmed to perform various control functions in accordance with the present invention, the invention can be implemented in hardware, for example, as an application specified integrated circuit (ASIC). As such, the process steps described herein are intended to be broadly interpreted as being equivalently performed by software, hardware, or a combination thereof.

Referring back to FIG. 1, the laser diode 110 of the RIN controlled wavelength stabilized laser 100 of FIG. 1 is pumped by current injection and is configured to emit radiation primarily from a front facet 112. The transmission fiber 150 may be either coupled to the laser diode 110 or located close enough such that the optical emission of the laser diode 110 propagates into the guided-mode portion of the transmission fiber 150. Alternatively, a RIN controlled wavelength stabilized laser in accordance with the present invention may further include a focusing system consisting of a lensing system to focus the emission of the laser diode into the transmission fiber.

The optical emission of the laser diode 110 propagates along the transmission fiber 150 to the intra-core Fiber Bragg Grating 120. The fiber grating 120 may be etched near the guided-mode portion of the transmission fiber 150 using known lithography techniques. Alternatively, the fiber grating 120 may be created by exposing the transmission fiber 150 to a pattern of periodic intensity variation of high influence ultraviolet light. If the latter technique is employed to fabricate the fiber grating of the present invention, it is convenient if the core of the transmission fiber has a concentration of germanium to render the core sensitive to the ultraviolet light that forms the fiber grating. The transmission fiber of the present invention may be a fiber that sustains a single or multiple spatial modes at the wavelength of emission of the laser diode of the present invention.

In FIG. 1, the fiber grating 120 provides optical feedback to the laser diode 110 by reflecting a portion of the emitted optical signal back towards the laser diode 110. A portion of the optical feedback signal is tapped by the optical coupler 130 and directed to the optical detector 140. The optical detector 140 measures the spectral properties of the feedback optical signal, and forwards the measurements, including information regarding the intensity of the reflected optical signal, to the control unit 145.

The control unit 145 receives the optical measurements from the optical detector 140, including at least the signal intensity of the reflected optical signal, and determines the change in the intensity of the reflected optical signal as a function of time. As such, the control unit is able to determine the relative intensity noise of the laser diode 110. From the determination of the amount of relative intensity noise of the laser diode 110, the control unit 145 generates a control signal relative to the distance between the gain peak of the laser diode 210 and the reflection peak of the fiber grating 120. The control signal generated by the control unit 145 is applied to either the laser diode 110 or the fiber grating 120 (or both) to adjust the wavelength of the gain peak of the laser diode 110 or the reflection peak of the fiber grating 120 (or both) in a manner tending to reduce the determined relative noise intensity.

Although in the RIN controlled wavelength stabilized laser 100 of FIG. 1 a portion of the optical feedback signal from the fiber grating 120 is tapped by the optical coupler 130 and directed to the optical detector 140 for measuring the spectral properties of the optical signal, which are ultimately used to determine the RIN of the laser diode 110, in alternate embodiments of the present invention an optical tap is not necessary. More specifically, in alternate embodiments of the invention where an included laser diode comprises a back facet photodiode typically used in such laser diodes to control the average output power of the laser chip, a portion of a signal detected by the back facet photodiode may be communicated to a control unit of the present invention for determining the RIN of the laser diode and for generating a control signal relative to the distance between the gain peak of the laser diode and the reflection peak of the fiber grating, the control signal being used to adjust the wavelength of the gain peak of the laser diode or the reflection peak of the fiber grating (or both) in a manner tending to reduce the determined relative noise intensity in accordance with the present invention.

As previously described, the inventors noted that the higher the separation between the gain peak of a laser diode and the reflection peak of a fiber grating, the higher the relative intensity noise. As such in various embodiments of the present invention, the control unit of the present invention determines, from the amount of the measured relative intensity noise in the reflected optical signal, a separation distance between the gain peak of the laser diode and the reflection peak of the fiber grating. The control unit then generates a control signal relative to the determined separation distance between the gain peak of the laser diode and the reflection peak of the fiber grating. The control signal is generated to alter the separation distance between the gain peak of the laser diode and the reflection peak of the fiber grating such that the measured relative intensity noise is reduced.

For example, in one embodiment of the present invention, the separation distance between the gain peak of the laser diode and the reflection peak of the fiber grating is determined by the control unit using a predetermined table located in a memory of the control unit. The stored table of the control unit correlates various separation distances between the gain peak of the laser diode and the reflection peak of the fiber grating with respective amounts of relative intensity noise levels. As such, the control unit generates a control signal relative to the determined separation distance to alter the separation distance between the gain peak of the laser diode and the reflection peak of the fiber grating in a manner tending to reduce the relative intensity noise.

For example in one embodiment of the present invention, the control unit of the present invention is adapted to generate a control signal that reduces or increases the injection current to the laser diode such that the temperature of the laser diode is altered. When the injection current is changed, the refractive index of the semiconductor is changed by the carrier density. The change in the temperature of the laser diode results in a change of wavelength in the gain peak of the laser diode such that the separation distance between the gain peak of the laser diode and the reflection peak of the fiber grating is reduced and, as such, the relative intensity noise is reduced.

However, in embodiments of the present invention where the output power of a laser diode is required to remain constant, the wavelength of the gain peak of the laser diode of the present invention may be altered by adjusting the temperature of the laser diode via an included thermoelectric cooler. More specifically, many laser diodes incorporate an active temperature control (e.g., thermo-electric cooler) for adjusting the temperature of the laser diode to correct for aging effects. For example, due to aging of a laser diode a driver current typically needs to be increased to keep the output power of the laser diode constant. As such, the laser diode temperature needs to be reduced by, for example, a thermoelectric cooler, to counteract a shift in the gain peak of the laser diode emission wavelength due to the increase in drive current. As such, a control unit of the present invention may generate a control signal to adjust the temperature of the laser diode via an included thermo-electric cooler in a manner tending to reduced a relative noise intensity of the laser diode.

In alternate embodiments of the present invention, the control unit of the present invention may be adapted to generate a control signal to alter the wavelength of the reflection peak of the fiber grating by for example, altering the temperature of a thermally tunable fiber grating. Again, the change in the temperature of the fiber grating results in a change of wavelength in the reflection peak of the fiber grating such that the separation distance between the gain peak of the laser diode and the reflection peak of the fiber grating is reduced and, as such, the relative intensity noise is reduced. Even further and as previously noted, alternatively the control unit of the present invention may be adapted to generate a control signal to alter both the wavelength of the gain peak of the laser diode and the wavelength of the reflection peak of the fiber grating such that the separation distance between the gain peak of the laser diode and the reflection peak of the fiber grating is reduced and, as such, the relative intensity noise is reduced.

In an alternate embodiment of the present invention, the control unit instead iteratively adjusts the wavelength of either the gain peak of the laser diode or the reflection peak of the fiber grating (or both) to alter the separation distance between the gain peak of the laser diode and the reflection peak of the fiber grating such that the relative intensity noise is reduced. The control unit in such an embodiment examines the spectral information from the optical detector and determines and records a relative intensity noise level of the laser diode. The control unit then compares the newly recorded relative intensity noise level to an existing relative intensity noise level recorded in a previous iteration. If a previous relative intensity noise level does not exist (this is the case for a first iteration) then the control unit generates a control signal to adjust the wavelength of the gain peak of the laser diode or to adjust the reflection peak of the fiber grating (or both) as described above in an attempt to reduce the determined relative intensity noise level. The control unit adjusts the wavelength of the gain peak of the laser diode or the reflection peak of the fiber grating (or both) either up or down in this first iteration and records the direction of the adjustment. The magnitude of the control signal is adjusted by a predefined maximum for each iteration.

In the next iteration, the control unit again examines and records a new relative intensity noise level determined from new spectral information received from the optical detector and then compares the newly recorded relative intensity noise level to the previously recorded relative intensity noise level. If the relative intensity noise level increased compared to the relative intensity noise level of the previous iteration, the control unit then generates a control signal to adjust the wavelength of the gain peak of the laser diode or the reflection peak of the fiber grating (or both) in the opposite direction of the previous iteration in an attempt to reduce the relative intensity noise level. If the relative intensity noise level decreased compared to the relative intensity noise level of the previous iteration, then the control unit again generates a control signal to adjust the wavelength of the gain peak of the laser diode or the reflection peak of the fiber grating (or both) in the same direction as the previous iteration in an attempt to further decrease the relative intensity noise level.

The sampling rate and processing rate of the optical detector and the control unit, respectively, may be configured to provide a wide range of update frequencies according to the sensitivity desired in the system. For example, the iterations of the optical detector and the control unit can be configured to run continuously. The present invention may be advantageously implemented in a wide range of update frequencies, limited only by the actual components implemented; for example the optical detector and the control unit. The control unit may also be configured to provide a wide range of scaling factors to be applied to the generated control signal. For example, the control signal may be scaled up or down by the control unit in fractions of a total injection current of the laser diode.

Embodiments of the present invention may further be implemented in systems comprising fiber grating type lasers for determining a wavelength difference between the gain peak of a laser diode and a reflection peak of a fiber grating. That is, by monitoring the relative intensity noise as described above, the control unit of the present invention is able to determine a wavelength difference between the gain peak of a laser diode and a reflection peak of a fiber grating. This may be accomplished by storing a table in a memory of the control unit associating amounts of relative intensity noise with respective wavelength differences between the gain peak of a laser diode and a reflection peak of a fiber grating. Information regarding the distance in wavelength between the gain peak of a laser diode and a reflection peak of a fiber grating may be useful in other applications.

Furthermore, embodiments of the present invention may be implemented in systems comprising fiber grating wavelength stabilized lasers for determining and monitoring if an included laser diode is locked by a fiber grating. More specifically, in such embodiments of the present invention, by monitoring the relative intensity noise as described above, the control unit of the present invention is able to determine if a laser diode becomes unlocked from fiber grating when a sudden substantial change in relative intensity noise is detected. In such a case, the emission spectrum of the laser diode is no longer the wavelength where the fiber grating has its maximum reflectivity. As such, a locked or unlocked condition may be determined.

Although various embodiments of the present invention are described above with respect to wavelength stabilized laser diodes, the concepts of the present invention may be implemented in systems comprising unstabilized laser diodes to reduce relative noise intensity or alternatively, to cause an unstabilized laser to become stabilized by adjusting the wavelength of the gain peak of an included laser diode or the reflection peak of an included fiber grating (or both) such that the center wavelength of emission from the laser diode remains near the wavelength of maximum reflection of the fiber grating.

Figure 3:
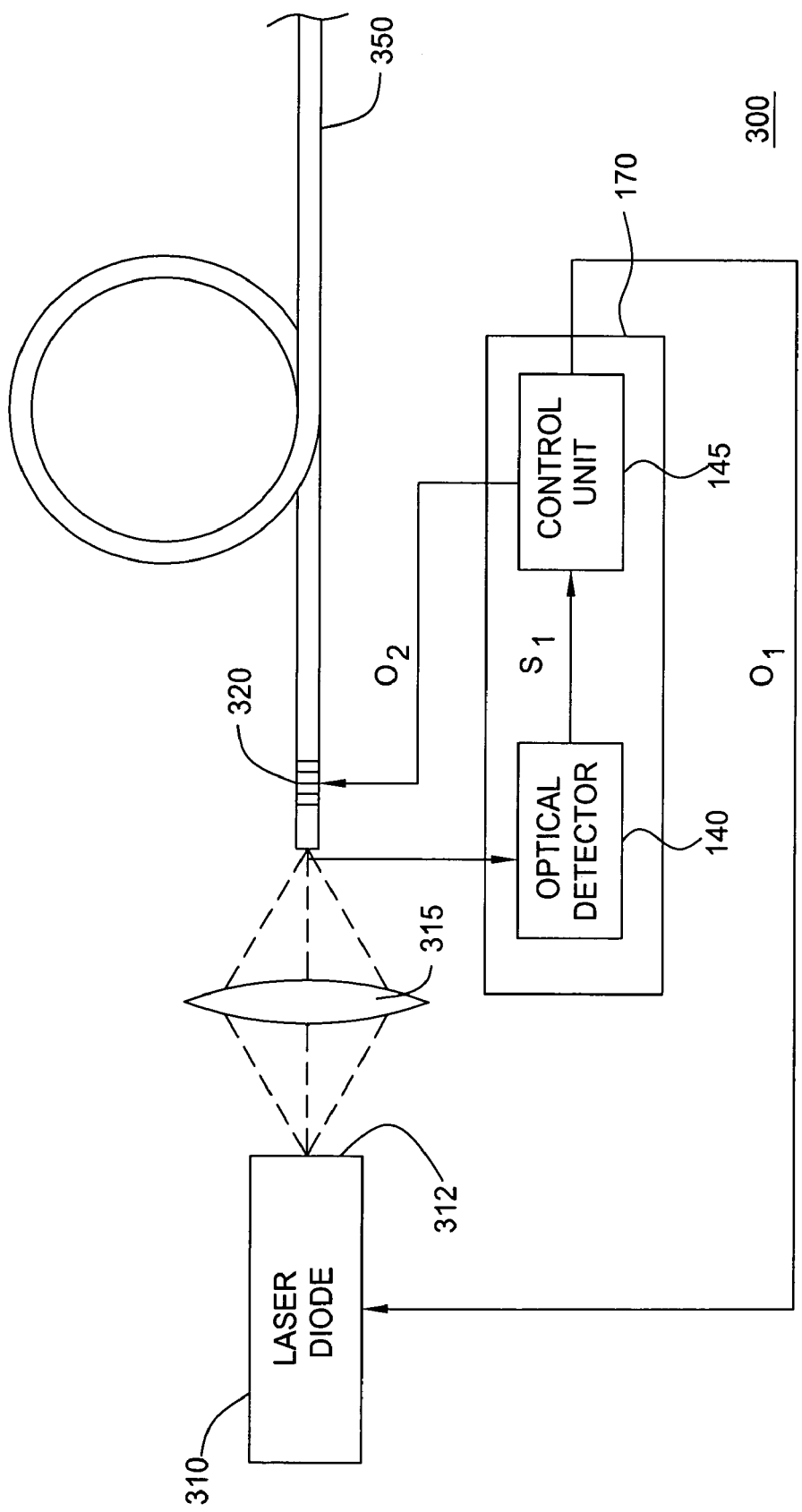
FIG. 3 depicts a high level block diagram of a typical wavelength stabilized laser including an embodiment of a relative intensity noise control device of the present invention.

In an alternate embodiment of the present invention, the previously described RIN control device 170 of the present invention may be incorporated into an existing fiber grating type laser diode system for performing the aspects of the present invention. For example, FIG. 3 depicts a high level block diagram of a typical wavelength stabilized laser. The wavelength stabilized laser 300 of FIG. 3 comprises a laser diode 310, a focusing system 315, a fiber grating (illustratively a Fiber Bragg Grating) 320 and a transmission fiber 350. The laser diode 310 of FIG. 3 is pumped by current injection and is configured to emit radiation primarily from a front facet 312. FIG. 3 further depicts an embodiment of the RIN control device 170 of the present invention. The RIN control device 170 of FIG. 3 comprises a control unit 145 and an optical detector 140.

By tapping a portion of a reflected optical signal of the wavelength stabilized laser as depicted in FIG. 3 and forwarding the tapped portion of the signal to an added RIN control device 170 in accordance with the present invention, the relative intensity noise of the laser diode may be monitored and used to control a wavelength separation between the gain peak of the laser diode 310 and a reflection peak of the fiber grating 320 as described above. As such, an existing laser diode system may be modified by an embodiment of the present invention to include the capability of controlling the relative intensity noise of the laser diode in accordance with the present invention.

While the forgoing is directed to various embodiments of the present invention, other and further embodiments of the invention may be devised without departing from the basic scope thereof. As such, the appropriate scope of the invention is to be determined according to the claims, which follow.

What is claimed is:

1. A method for reducing a relative intensity noise of a fiber grating type laser diode including a fiber grating and a laser diode, comprising:
   detecting at least a portion of an optical signal of said fiber grating type laser diode;
   determining the relative intensity noise of said laser diode using said detected optical signal; and
   reducing a difference between a maximum gain wavelength of said laser diode and a maximum reflection wavelength of a fiber grating of said fiber grating type laser diode in a manner tending to reduce the relative intensity noise of said fiber grating type laser diode by selectively controlling the laser diode and the fiber grating.

2. The method of claim 1, wherein said portion of the optical signal detected is a reflected portion of an optical signal of said laser diode, said optical signal being reflected by said fiber grating.

3. The method of claim 2, wherein the reflected portion of the optical signal of said laser diode is detected by a detector positioned on a front face of said laser diode.

4. The method of claim 1, wherein said relative intensity noise is determined by detecting a change in intensity of an output power of said detected optical signal as a function of time.

5. The method of claim 1, wherein the difference between the maximum gain wavelength of said laser diode and the maximum reflection wavelength of said fiber grating is determined from said detected optical signal.

6. The method of claim 1, wherein the difference between the maximum gain wavelength of said laser diode and The maximum reflection wavelength of said fiber grating is reduced by adjusting the maximum gain wavelength of said laser diode.

7. The method of claim 6, wherein the maximum gain wavelength of said laser diode is adjusted by adjusting an amount of a current injection applied to said laser diode.

8. The method of claim 6, wherein the maximum gain wavelength of said laser diode is adjusted by altering the temperature of said laser diode.

9. The method of claim 8, wherein the temperature of said laser diode is altered by adjusting a thermo-electric cooler of said laser diode.

10. The method of claim 1, wherein the difference between the maximum gain wavelength of said laser diode and the maximum reflection wavelength of said fiber grating is reduced by adjusting the maximum reflection wavelength of said fiber grating.

11. The method of claim 10, wherein the maximum reflection wavelength of said fiber grating is adjusted by altering the temperature of said fiber grating.

12. The method of claim 11, wherein the temperature of said fiber grating is altered by adjusting a thermo-electric cooler of said fiber grating.

13. The method of claim 1, wherein the difference between the maximum gain wavelength of said laser diode and the maximum reflection wavelength of said fiber grating is reduced by adjusting the wavelength of at least one of the maximum gain wavelength of said laser diode and the maximum reflection wavelength of said fiber grating.

14. A relative intensity noise (RIN) control device for controlling the RIN of a fiber grating type laser diode including a fiber grating and a laser diode, comprising:
   an optical detector for detecting at least a portion of an optical signal of said fiber grating type laser diode; and
   a control unit comprising a memory for storing information and program instructions and a processor for executing said instructions, said control unit selectively controls the laser diode and the fiber grating by performing the steps of:
   determining, from said detected optical signal, the relative intensity noise of said laser diode; and
   reducing a difference between a maximum gain wavelength of said laser diode and a maximum reflection wavelength of said fiber grating in a manner tending to reduce the relative intensity noise of said laser diode.

15. The RIN control device of claim 14, wherein the difference between the maximum gain wavelength of said laser diode and the maximum reflection wavelength of said fiber grating is determined by said control unit from said detected optical signal.

16. The RIN control device of claim 14, wherein said control unit comprises a look-up table in said memory for correlating a difference between a maximum gain wavelength of said laser diode and a maximum reflection wavelength of said fiber grating with a corresponding relative intensity noise level, and the difference between the maximum gain wavelength of said laser diode and the maximum reflection wavelength of said fiber grating is determined by said control unit using said determined relative intensity noise and said look-up table.

17. The RIN control device of claim 14, wherein said control unit is further adapted to generate a control signal to adjust the maximum gain wavelength of said laser diode such that the difference between the maximum gain wavelength of said laser diode and the maximum reflection wavelength of said fiber grating is reduced.

18. The RIN control device of claim 17, wherein said control signal is adapted to adjust an amount of a current injection applied to said laser diode.

19. The RIN control device of claim 17, wherein said control signal is adapted to adjust a temperature of said laser diode.

20. The RIN control device of claim 14, wherein said control unit is further adapted to generate a control signal to adjust the maximum reflection wavelength of said fiber grating such that the difference between the maximum gain wavelength of said laser diode and the maximum reflection wavelength of said fiber grating is reduced.

21. The RIN control device of claim 20, wherein said control signal is adapted to adjust a temperature of said fiber grating.

22. A relative intensity noise (RIN) controlled fiber grating type laser diode, comprising:
- a laser diode for providing an optical signal;
- a fiber grating for reflecting at least a portion of said optical signal back toward said laser diode and transmitting the remaining portion of said optical signal;
- an optical detector for detecting at least one of said reflected portion of said optical signal and said transmitted portion of said optical signal; and
- a control unit comprising a memory for storing information and program instructions and a processor for executing said instructions, said control unit selectively controls the laser diode and the fiber grating by performing the steps of:
- determining the relative intensity noise of said laser diode from said detected optical signal; and
- reducing a difference between a maximum gain wavelength of said laser diode and a maximum reflection wavelength of said fiber grating in a manner tending to reduce the relative intensity noise of said laser diode.

23. The RIN controlled fiber grating type laser diode of claim 22, wherein said fiber grating is etched near a guided-mode portion of an optical fiber of said RIN controlled fiber grating type laser diode, said optical fiber used for propagating optical signals of said laser diode.

24. The RIN controlled fiber grating type laser diode of claim 22, wherein said fiber grating is formed in an optical fiber of said RIN controlled fiber grating type laser diode by exposing said optical fiber to a pattern of periodic intensity variations of high influence ultraviolet light.

25. The RIN controlled fiber grating type laser diode of claim 24, wherein a core of said optical fiber has a concentration of germanium to render the core sensitive to the ultraviolet light.

26. The RIN controlled fiber grating type laser diode of claim 22, further comprising an optical isolator located further downstream from said fiber grating for preventing optical signals from traveling upstream to said laser diode.

27. The RIN controlled fiber grating type laser diode of claim 22, wherein said optical detector is positioned at a front facet of said laser diode for detecting the reflected portion of the optical signal.

* * * * *